(12) United States Patent
Mo

(10) Patent No.: US 6,521,497 B2
(45) Date of Patent: Feb. 18, 2003

(54) METHOD OF MANUFACTURING A FIELD EFFECT TRANSISTOR

(75) Inventor: Brian Sze-Ki Mo, Fremont, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/854,102

(22) Filed: May 9, 2001

(65) Prior Publication Data

US 2001/0023104 A1 Sep. 20, 2001

Related U.S. Application Data

(62) Division of application No. 08/970,221, filed on Nov. 14, 1997, now Pat. No. 6,429,481.

(51) Int. Cl.$^7$ .............................................. H01L 21/336
(52) U.S. Cl. ..................... 438/270; 438/268; 438/269
(58) Field of Search ................................ 438/270, 272, 438/589, 268, 269

(56) References Cited

U.S. PATENT DOCUMENTS

| | | | | | |
|---|---|---|---|---|---|
| 5,460,985 A | * | 10/1995 | Tokura et al. | ...... | 148/DIG. 116 |
| 5,474,943 A | * | 12/1995 | Hshieh et al. | ..... | 148/DIG. 103 |
| 5,688,725 A | * | 11/1997 | Darwish et al. | ............ | 438/270 |
| 5,689,128 A | * | 11/1997 | Hsieh et al. | ................ | 257/331 |
| 5,763,915 A | * | 6/1998 | Hsieh et al. | ................ | 257/330 |
| 5,776,812 A | * | 7/1998 | Takahashi et al. | .......... | 438/268 |
| 5,780,324 A | * | 7/1998 | Tokura et al. | .............. | 438/135 |
| 5,814,858 A | * | 9/1998 | Williams | .................... | 257/328 |
| 5,879,971 A | * | 3/1999 | Witek | ......................... | 438/238 |
| 5,930,630 A | * | 7/1999 | Hshieh et al. | .............. | 438/268 |
| 5,986,304 A | * | 11/1999 | Hshieh et al. | .............. | 257/330 |
| 6,015,737 A | * | 1/2000 | Tokura et al. | .............. | 438/138 |

* cited by examiner

Primary Examiner—John F. Niebling
Assistant Examiner—Angel Roman
(74) Attorney, Agent, or Firm—Townsend and Townsend and Crew LLP

(57) ABSTRACT

A method of manufacturing a trenched field effect transistor that includes a heavy body structure. The method includes forming a plurality of trenches into a semiconductor substrate having dopants of a first conductivity type, wherein the gate electrode of the transistor is formed. A doped well having dopants of a second conductivity type is formed into the substrate and between the trenches. Source regions having dopants of the first conductivity type are formed inside the doped well adjacent to and on opposite sides of the trenches. A heavy body region having dopants of the second conductivity type is formed inside each doped well and at a depth that is shallower than the doped well. The heavy body is formed in a manner that makes an abrupt junction between the heavy body and the well. In one embodiment, the abrupt junction is formed by a dobule implant process.

18 Claims, 9 Drawing Sheets

OXIDE n⁻ epi

OXIDE n⁻ epi

OXIDE n⁻ epi    DEEP p⁺

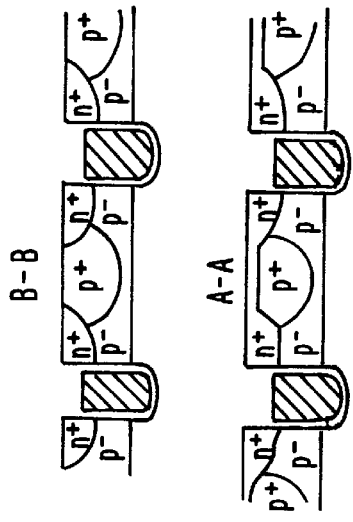
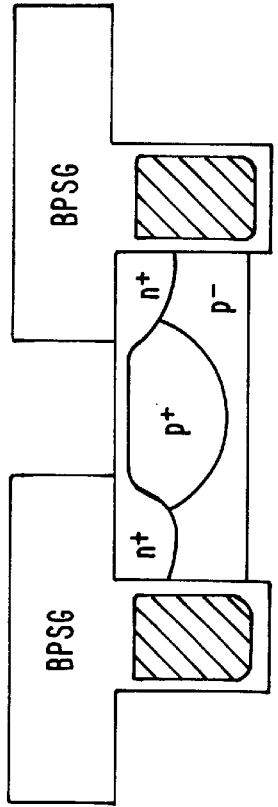
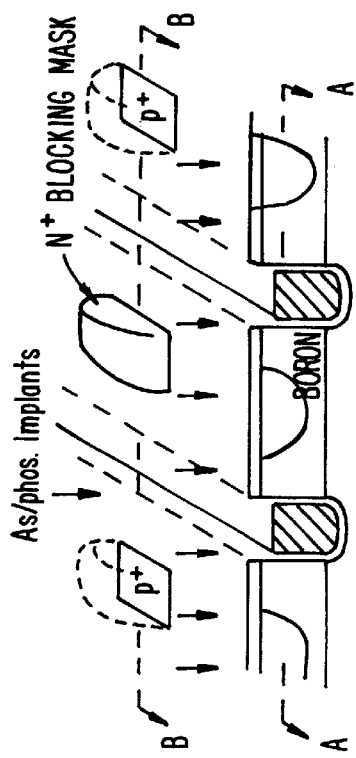
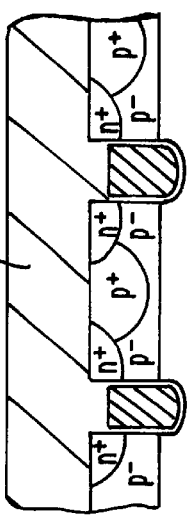
FIG. 4I.
FIG. 4J.
FIG. 4K.

METHOD OF MANUFACTURING A FIELD EFFECT TRANSISTOR

This application is a division of U.S. application Ser. No. 08/970,221 filed Nov. 14, 1997 now U.S Pat. No. 6,429,481.

BACKGROUND OF THE INVENTION

The present invention relates to filed effect transistors, in particular trench DMOS transistors, and methods of their manufacture.

Power field effect transistors, e.g., MOSFETs (metal oxide semiconductor field effect transistors), are well known in the semiconductor industry. One type of MOSFET is a DMOS (double diffused metal oxide semiconductor) transistor. DMOS transistors typically include a substrate on which an epitaxial layer is grown, a doped source junction, a doped heavy body, a doped well of the same (p or n) doping as the heavy body, and a gate electrode. In trenched DMOS transistors the gate electrode is a vertical trench. The heavy body is typically diffused deeper than the bottom of the trench, to minimize electric field at the bottom corners of the trench and thereby prevent avalanche breakdown from damaging the device. The trench is filled with conductive polysilicon, and the polysilicon is generally overetched, to assure that it is completely removed from the surface surrounding the trench. This overetching generally leaves a recess between the top of the polysilicon and the surface of the semiconductor substrate (i.e., the surface of the epitaxial layer). The depth of this recess must be carefully controlled so that it is shallower than the depth of the source junctions. If the recess is deeper than the source junctions the source may miss the gate, resulting in high on-state resistance, high threshold, and potentially a non-functional transistor.

The source and drain junctions can be doped with either p-type or n-type dopants; in either case, the body will be doped with the opposite dopant, e.g., for n-type source and drain the body will be p-type. DMOS transistors in which the source and drain are doped with p-type carriers are referred to as "p-channel". In p-channel DMOS transistors a negative voltage applied to the transistor gate causes current flow from the source region, through a channel region of the body, an accumulation region of the epitaxial layer, and the substrate, to the drain region. Conversely, DMOS transistors, in which the source and drain are doped with n-type carriers, are referred to as "n-channel". In n-channel DMOS transistors a positive voltage applied to the transistor gate causes current to flow from drain to source.

It is desirable that DMOS transistors have low source to drain resistance ($Rds_{on}$) when turned on and low parasitic capacitance. The transistor structure should also avoid "punch through". Punchthrough occurs when, upon application of a high drain to source voltage, depletion into the body region extends to the source region, forming an undesirable conductive path through the body region when the transistor should be off. Finally, the transistor should have good "ruggedness", i.e., a high activation current is needed to turn on the parasitic transistor that inherently exists in DMOS transistors.

Generally a large number of MOSFET cells are connected in parallel forming a single transistor. The cells may be arranged in a "closed cell" configuration, in which the trenches are laid out in a grid pattern and the cells are enclosed on all sides by trench walls. Alternatively, the cells may be arranged in an "open cell" configuration, in which the trenches are laid out in a "stripe" pattern and the cells are only enclosed on two sides by trench walls. Electric field termination techniques are used to terminate junctions (doped regions) at the periphery (edges) of the silicon die on which the transistors are formed. This tends to cause the breakdown voltage to be higher than it would otherwise be if controlled only by the features of the active transistor cells in the central portions of the die.

SUMMARY OF THE INVENTION

The present invention provides field effect transistors that have an open cell layout that provides good uniformity and high cell density and that is readily scalable. Preferred trenched DMOS transistors exhibit low $Rds_{on}$, low parasitic capacitance, excellent reliability, resistance to avalanche breakdown degradation, and ruggedness. Preferred devices also include a field termination that enhances resistance to avalanche breakdown. The invention also features a method of making trench DMOS transistors.

In one aspect, the invention features a trenched field effect transistor that includes (a) a semiconductor substrate, (b) a trench extending a predetermined depth into the semiconductor substrate, (c) a pair of doped source junctions, positioned on opposite sides of the trench, (d) a doped heavy body positioned adjacent each source junction on the opposite side of the source junction from the trench, the deepest portion of the heavy body extending less deeply into said semiconductor substrate than the predetermined depth of the trench, and (e) a doped well surrounding the heavy body beneath the heavy body.

Preferred embodiments include one or more of the following features. The doped well has a substantially flat bottom. The depth of the heavy body region relative to the depths of the well and the trench is selected so that the peak electric field, when voltage is applied to the transistor, will be spaced from the trench. The doped well has a depth less than the predetermined depth of the trench. The trench has rounded top and bottom corners. There is an abrupt junction at the interface between the heavy body and the well, to cause the peak electric field, when voltage is applied to the transistor, to occur in the area of the interface.

In another aspect, the invention features an array of transistor cells. The array includes (a) a semiconductor substrate, (b) a plurality of gate-forming trenches arranged substantially parallel to each other and extending in a first direction, the space between adjacent trenches defining a contact area, each trench extending a predetermined depth into said substrate, the predetermined depth being substantially the same for all of said gate forming trenches; (c) surrounding each trench, a pair of doped source junctions, positioned on opposite sides of the trench and extending along the length of the trench, (d) positioned between each pair of gate-forming trenches, a doped heavy body positioned adjacent each source junction, the deepest portion of each said heavy body extending less deeply into said semiconductor substrate than said predetermined depth of said trenches, (e) a doped well surrounding each heavy body beneath the heavy body; and (f) p+ and n+ contacts disposed at the surface of the semiconductor substrate and arranged in alternation along the length of the contact area.

Preferred embodiments include one or more of the following features. The doped well has a substantially flat bottom. The depth of each heavy body region relative to the depths of the wells and the gate-forming trenches is selected so that the peak electric field, when voltage is applied to the transistor, will be spaced from the trench. The doped wells have a depth less than the predetermined depth of the trenches. The trenches have rounded top and bottom corners.

There is an abrupt junction at the interface between each heavy body and the corresponding well, to cause the peak electric field, when voltage is applied to the transistor, to occur in the area of the interface. The array also includes a field termination structure surrounding the periphery of the array. The field termination structure includes a well having a depth greater than that of the gate-forming trenches. The field termination structure includes a termination trench extending continuously around the periphery of the array, more preferably a plurality of concentrically arranged termination trenches.

In yet another aspect, the invention features a semiconductor die that includes (a) a plurality of DMOS transistor cells arranged in an array on a semiconductor substrate, each DMOS transistor cell including a gate-forming trench, each of said gate-forming trenches having a predetermined depth, the depth of all of the gate-forming trenches being substantially the same; and (b) surrounding the periphery of the array, a field termination structure that extends into the semiconductor substrate to a depth that is deeper than said predetermined depth of said gate-forming trenches.

Preferred embodiments include one or more of the following features. The first and second dopants both comprise boron. The first energy is from about 150 to 200 keV. The first dosage is from about 1E15 to 5E15 $cm^{-2}$. The second energy is from about 20 to 40 keV. The second dosage is from about 1E14 to 1E15 $cm^{-2}$.

The invention also features a method of making a heavy body structure for a trenched DMOS transistor including (a) providing a semiconductor substrate; (b) implanting into a region of the substrate a first dopant at a first energy and dosage; and (c) subsequently implanting into said region a second dopant at a second energy and dosage, said second energy and dosage being relatively less than said first energy and dosage.

Preferred embodiments include one or more of the following features. The first and second dopants both comprise boron. The first energy is from about 150 to 200 keV. The first dosage is from about 1E15 to 5E15. The second energy is from about 20 to 40 keV. The second dosage is from about 1E14 to 1E15.

Additionally, the invention features a method of making a source for a trenched DMOS transistor including (a) providing a semiconductor substrate; (b) implanting into a region of the substrate a first dopant at a first energy and dosage; and (c) subsequently implanting into the region a second dopant at a second energy and dosage, the second energy and dosage being relatively less than the first energy and dosage.

Preferred embodiments include one or more of the following features. The first dopant comprises arsenic and the second dopant comprises phosphorus. The first energy is from about 80 to 120 keV. The first dosage is from about 5E15 to 1E16 $cm^{-2}$. The second energy is from about 40 to 70 keV. The second dosage is from about 1E15 to 5E15 $cm^{-2}$. The resulting depth of the source is from about 0.4 to 0.8 $\mu m$ the finished DMOS transistor.

In another aspect, the invention features a method of manufacturing a trenched field effect transistor. The method includes (a) forming a field termination junction around the perimeter of a semiconductor substrate, (b) forming an epitaxial layer on the semiconductor substrate, (c) patterning and etching a plurality of trenches into the epitaxial layer; (d) depositing polysilicon to fill the trenches, (e) doping the polysilicon with a dopant of a first type, (f) patterning the substrate and implanting a dopant of a second, opposite type to form a plurality of wells interposed between adjacent trenches, (g) patterning the substrate and implanting a dopant of the second type to form a plurality of second dopant type contact areas and a plurality of heavy bodies positioned above the wells, each heavy body having an abrupt junction with the corresponding well, (h) patterning the substrate and implanting a dopant of the first type to provide source regions and first dopant type contact areas; and (i) applying a dielectric to the surface of the semiconductor substrate and patterning the dielectric to expose electrical contact areas.

Other features and advantages of the invention will be apparent from the following detailed description, and from the claims.

BRIEF DESCRIPTION OF THE DRAWINGS

In FIGS. 1a and 1b the source metal and dielectric layers are shown.

DESCRIPTION OF THE PREFERRED EMBODIMENTS

Figure 1:
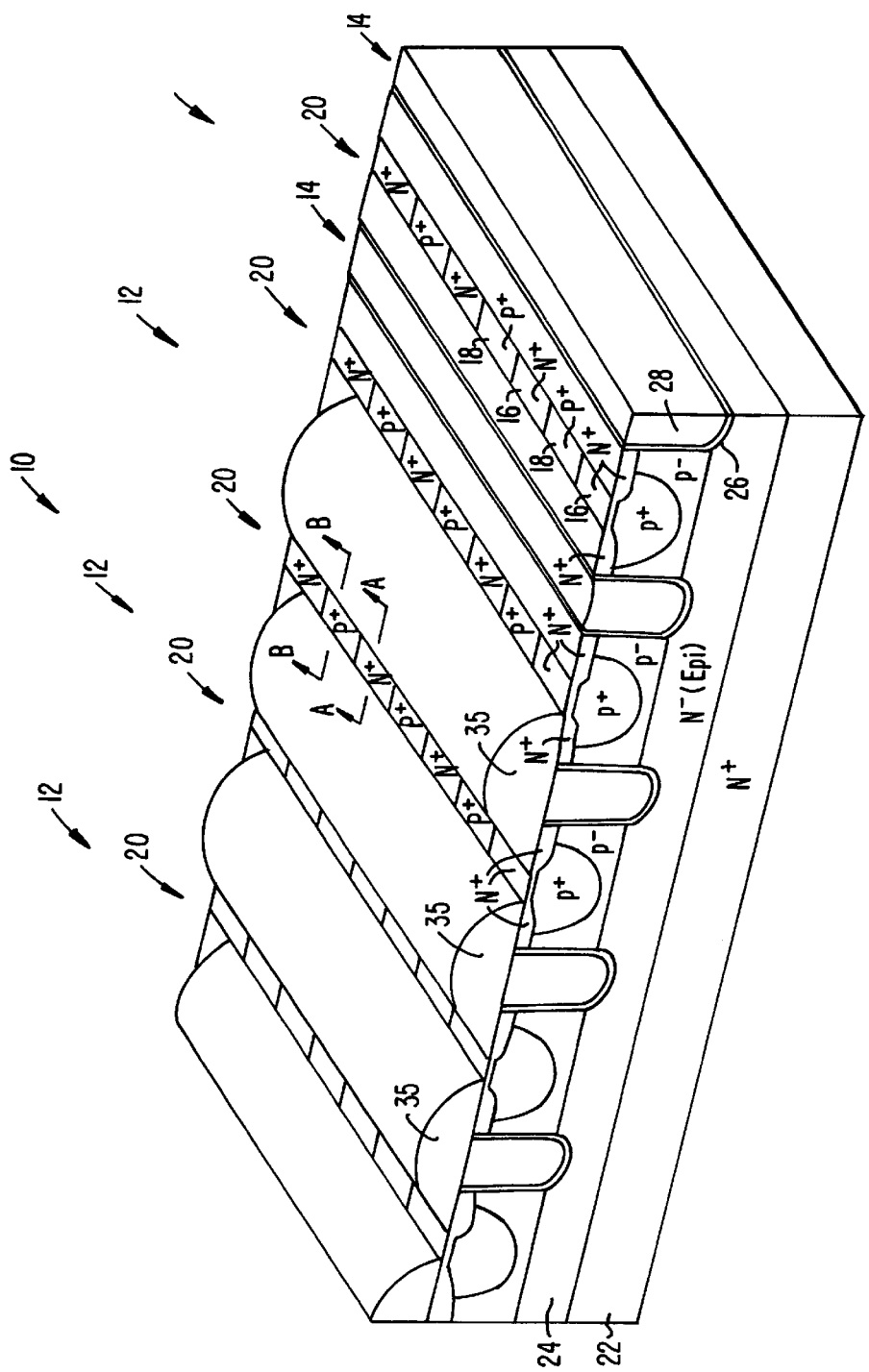
FIG. 1 is a highly enlarged, schematic perspective cross-sectional view showing a portion of a cell array including a plurality of DMOS transistors according to one aspect of the invention. The source metal layer and a portion of the dielectric layer have been omitted to show the underlying layers.

A cell array 10, including a plurality of rows 12 of trenched DMOS transistors, is shown in FIG. 1. Cell array 10 has an open cell configuration, i.e., trenches 14 run in only one direction, rather than forming a grid. Individual cells are formed by alternating n+ source contacts 16 and p+ contacts 18 in rows 20 that run parallel to and between trenches 14. The configuration of the regions of each row that have an n+ source contact are shown in cross-section in FIG. 1a, while the regions that have a p+ contact are shown in FIG. 1b.

Figure 1A:
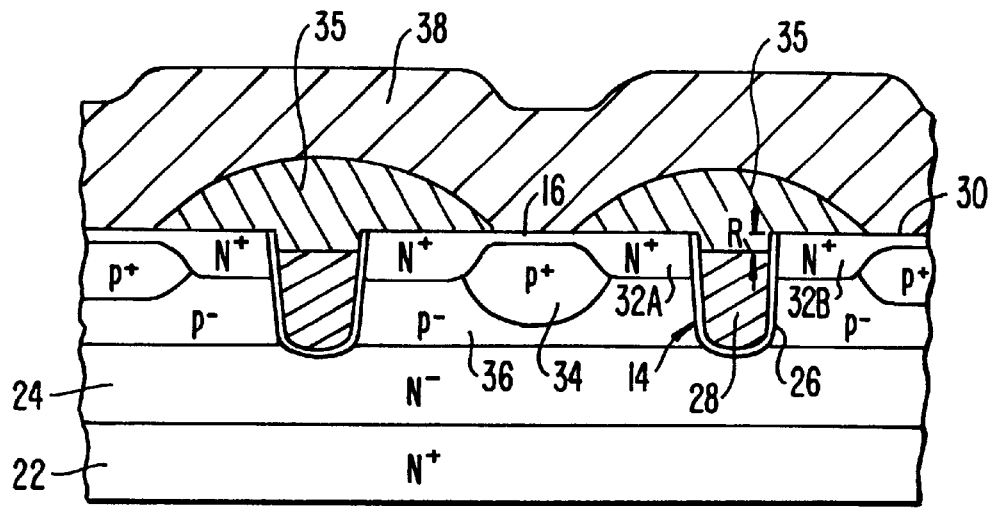
FIGS. 1a and 1b are side cross-sectional views of a single line of transistors from the array of FIG. 1, taken along lines A—A and B—B, respectively.
Figure 1B:
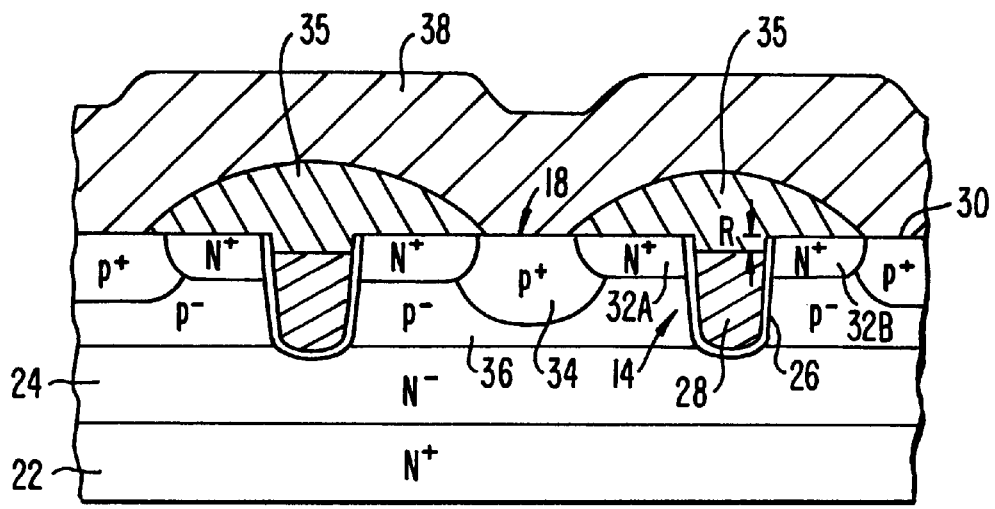

As shown in FIGS. 1a and 1b, each trenched DMOS transistor includes a doped n+ substrate (drain) layer 22, a more lightly doped n− epitaxial layer 24, and a gate electrode 28. Gate electrode 28 comprises a conductive polysilicon that fills a trench 14. A gate oxide 26 coats the walls of the trench and underlies the polysilicon. The top surface of the polysilicon is recessed from the surface 30 of the semiconductor substrate by a distance R (typically from about 0 to 0.4 $\mu m$). N+ doped source regions 32a, 32b are positioned one on each side of the trench 14. A dielectric layer 35 covers the trench opening and the two source regions 32a, 32b. Extending between the source regions of adjacent cells is a p+ heavy body region 34 and, beneath it, a flat-bottomed p− well 36. In the areas of the cell array which have a n+ contact 16, a shallow n+ doped contact region extends between the n+source regions. A source metal layer 38 covers the surface of the cell array.

The transistor shown in FIGS. 1a and 1b includes several features that enhance the ruggedness of the transistor and its resistance to avalanche breakdown degradation.

First, the depth of the p+ heavy body region 34 relative to the depths of the trench 14 and the flat bottom of the p− well is selected so that the peak electric field when voltage is applied to the transistor will be approximately halfway between adjacent trenches. The preferred relative depths of the p+heavy body, the p− well and the trench are different for different device layouts. However, preferred relative depths can be readily determined empirically (by observing the location of peak electric field) or by finite element analysis.

Second, the bottom corners of the trench 14 are rounded (preferably, the top corners are also rounded; this feature is not shown). Corner rounding can be achieved using the process described in copending application U.S. Ser. No. 08/959,197, filed on Oct. 28, 1997. The rounded corners of the trench also tend to cause the peak electric field to be moved away from the trench corners and towards a central location between adjacent trenches.

Third, an abrupt junction at the interface between the p+ heavy body and the p− well causes the peak electric field to occur in that area of the interface. Avalanche multiplication initiates at the location of the peak electric field, thus steering hot carriers away from the sensitive gate oxide and channel regions. As a result, this structure improves reliability and avalanche ruggedness without sacrificing cell density as much as a deeper heavy body junction. This abrupt junction can be achieved by the double doping process that will be described below, or by other processes for forming abrupt junctions, many of which are known in the semiconductor field.

Figure 2:
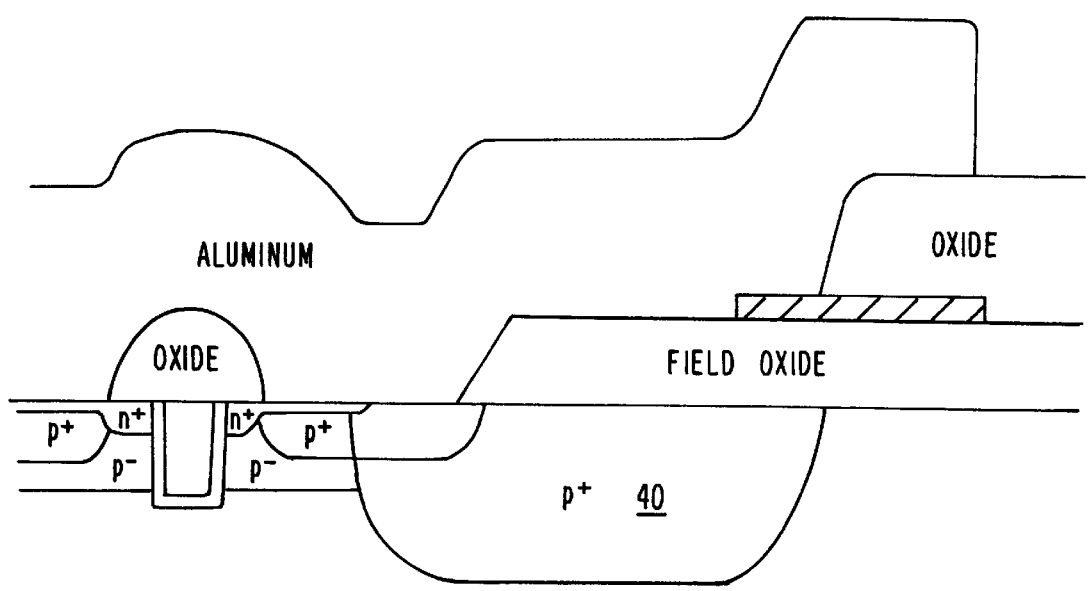
FIG. 2 is a highly enlarged schematic side cross-sectional view of a semiconductor die showing a portion of the cell array and the field termination.

Lastly, referring to FIG. 2, the cell array is surrounded by a field termination junction 40 which increases the breakdown voltage of the device and thaws avalanche current away from the cell array to the periphery of the die. Field termination junction 40 is a deep p+ well, preferably from about 1 to 3 μm deep at its deepest point, that is deeper than the p+ heavy body regions 34 in order to reduce the electric field caused by the junction curvature. A preferred process for making the above-described transistors is shown as a flow diagram in FIG. 3, and the individual steps are shown schematically in FIGS. 4–4k. It is noted that some steps that are conventional or do not require illustration are described below but not shown in FIGS. 4–4k. As indicated by the arrows in FIG. 3, and as will be discussed below, the order of the steps shown in FIGS. 4–4k can be varied. Moreover, some of the steps shown in FIGS. 4–4k are optional, as will be discussed.

A semiconductor substrate is initially provided. Preferably, the substrate is a N++ Si substrate, having a standard thickness, e.g., 500 μm, and a very low resistivity, e.g., 0.001 to 0.005 Ohm-cm. An epitaxial layer is deposited onto this substrate, as is well known, preferably to a thickness of from about 4 to 10 μm. Preferably the resistivity of the epitaxial layer is from about 0.1 to 3.0 Ohm-cm.

Figures 4, 4A, 4B:
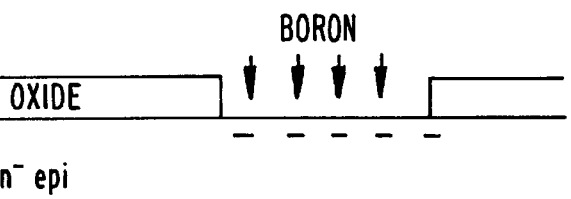
FIGS. 4–4k are schematic side cross-sectional views showing the individual steps of the process diagramed in FIG. 3. The figure numbers for the detailed views in FIGS. 4–4k are shown parenthetically under the corresponding diagram boxes in FIG. 3.
Figure 4C:
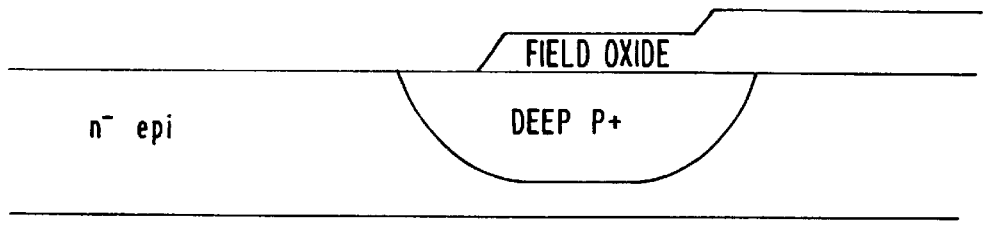

Next, the field termination junction 40 is formed by the steps shown in FIGS. 4–4c. FIG. 4, an oxide layer is formed on the surface of the epitaxial layer. Preferably, the thickness of the oxide is from about 5 to 10 kÅ. Next, as shown in FIG. 4a, the oxide layer is patterned and etched to define a mask, and the p+ dopant is introduced to form the deep p+ well field termination. A suitable dopant is boron, implanted at an energy of from about 40 to 100 keV and a dose of 1E14 ($1 \times 10^{14}$) to 1E16 cm$^{-2}$. As shown in FIG. 4b, the p+ dopant is then driven further into the substrate, e.g., by diffusion, and a field oxide layer is formed over the p+ junction. Preferably the oxide thickness is from about 4 to 10 kÅ. Finally, the oxide (FIG. 4) over the active area of the substrate (the area where the cell array will be formed) is patterned and removed by any suitable etching process, leaving only the field oxide in suitable areas. This leaves the substrate ready for the following steps that will form the cell array.

It is noted that, as an alternative to steps 4–4c, a suitable field termination structure can be formed using a ring-shaped trench which surrounds the periphery of the cell array and acts to lessen the electric field and increase the resistance to avalanche breakdown degradation. This trench field termination does not require a field oxide or deep p+ body junction to be effective. Consequently, it can be used to reduce the number of process steps. Using a trench ring (or multiple concentric trench rings) to form a field termination is described in, e.g., U.S. Pat. No. 5,430,324, the full disclosure of which is hereby incorporated herein by reference. Preferably, the trench would have substantially the same depth as the trenches in the cell array.

Figure 4D:
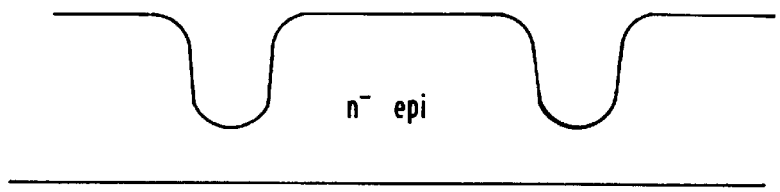

The cell array is formed by the steps shown in FIGS. 4d–4k. First, a plurality of trenches are patterned and etched into the epitaxial layer of the substrate (FIG. 4d). Preferably, as noted above, the trenches are formed using the process described in copending application U.S. Pat. No. 08/959,197, so that the upper and lower corners of each trench will be smoothly rounded. As shown in FIG. 1 and described above, the trenches are patterned to run in only one direction, defined as an open cell structure. After trench formation, a gate oxide layer is formed on the trench walls, as is well known in the semiconductor field. Preferably the gate oxide has a thickness of from about 100 to 800 Å.

Figure 4E:
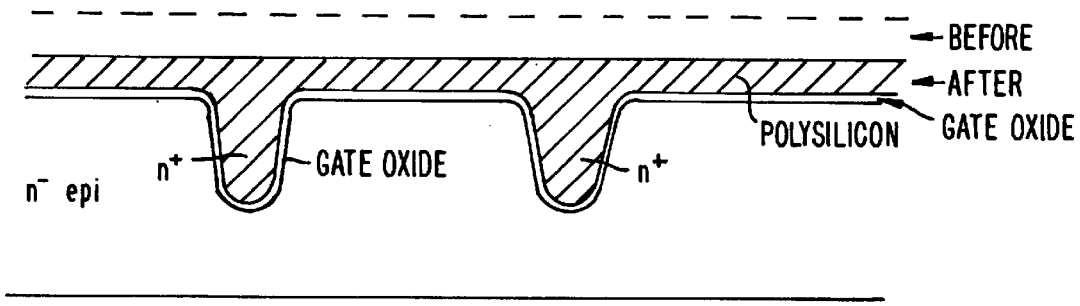

Next, as shown in FIG. 4e, polysilicon is deposited to fill the trench and cover the surface of the substrate, generally to a thickness of from about 1 to 2 μm depending on the trench width (shown by the dotted lines in FIG. 4e). This layer is then planarized by the nature of its thickness relative to the trench width, typically from about 2 to 5 k Å (indicated by solid lines in FIG. 4e). The polysilicon is then doped to n-type, e.g., by conventional POCL$_3$ doping or by phosphorus implant. The backside of the wafer need not be stripped (as is conventionally done prior to doping the polysilicon to enhance defect gettering) because any further doping of the highly doped substrate would be unlikely to result in any enhancement in defect gettering.

Figure 4F:
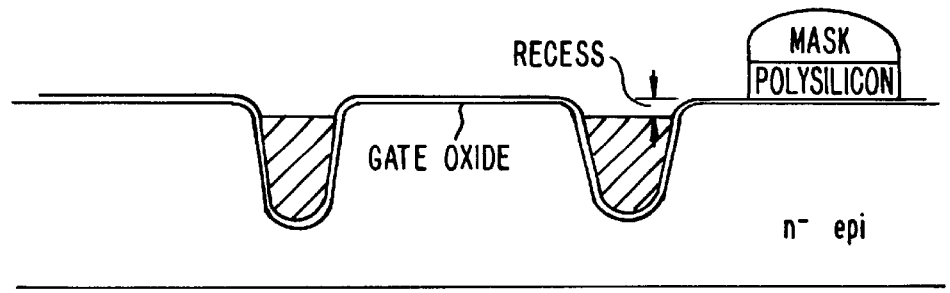

The polysilicon is then patterned with a photoresist mask and etched to remove it from the trench areas, as shown in FIG. 4f. A small recess between the top of the polysilicon in the trench and the substrate surface inherently results when the polysilicon is etched completely to remove all of the polysilicon from the substrate surface. The depth of this recess must be controlled so that it does not exceed the depth of the n+ source junction that will be formed in a later step. To reduce the need to carefully control this aspect of the process, a relatively deep n+ source junction is formed, as will be discussed below.

Figure 4G:
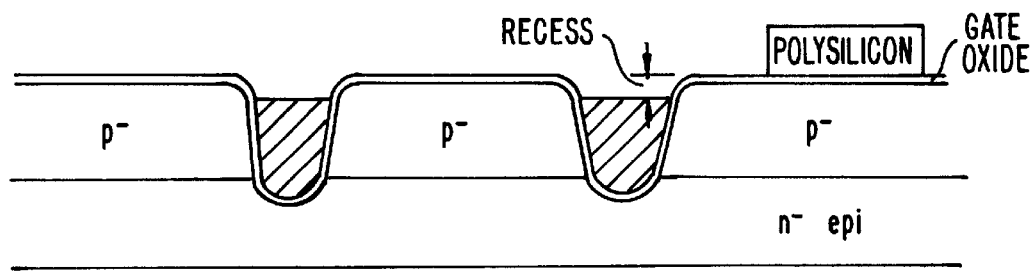

Then, as shown in FIG. 4g, the p− well is formed by implanting the dopant, e.g., a boron implant at an energy of 30 to 100 keV and a dosage of 1E13 to 1E15, and driving it in to a depth of from about 1 to 3 μm using conventional drive in techniques.

Figure 3:
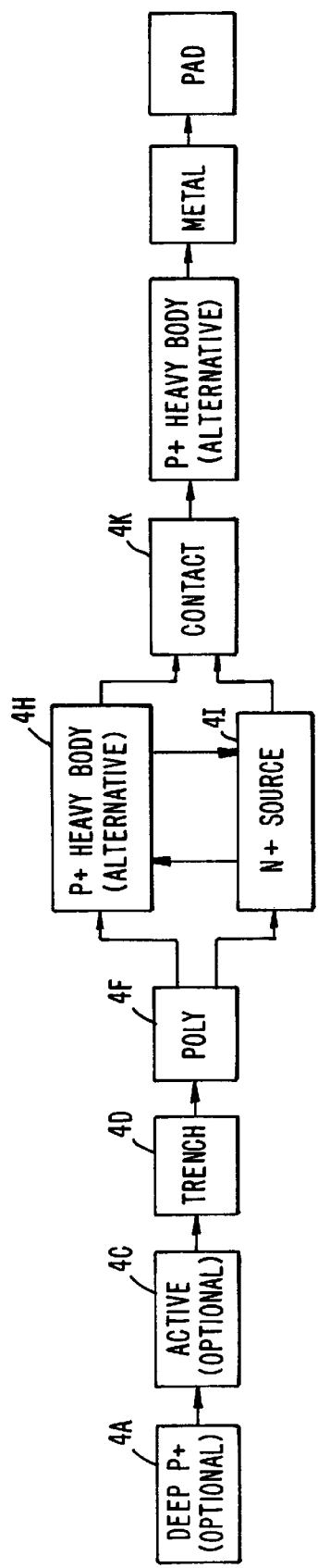
FIG. 3 is a flow diagram showing the photo mask sequence of a preferred process for forming a trench DMOS transistor of FIG. 1.

The next two steps (p+ heavy body formation) can be performed either before formation of the n+ source junction, or afterwards, as indicated by the arrows in FIG. 3. P+ heavy body formation and n+ source junction formation can be performed in either order because they are both resist-masked steps and because there is no diffusion step in between. This advantageously allows significant process flexibility. The p+ heavy body formation steps will be described below as being performed prior to source formation; it will be understood that n+ source formation could be performed first simply by changing the order of the steps discussed below.

Figure 4H:
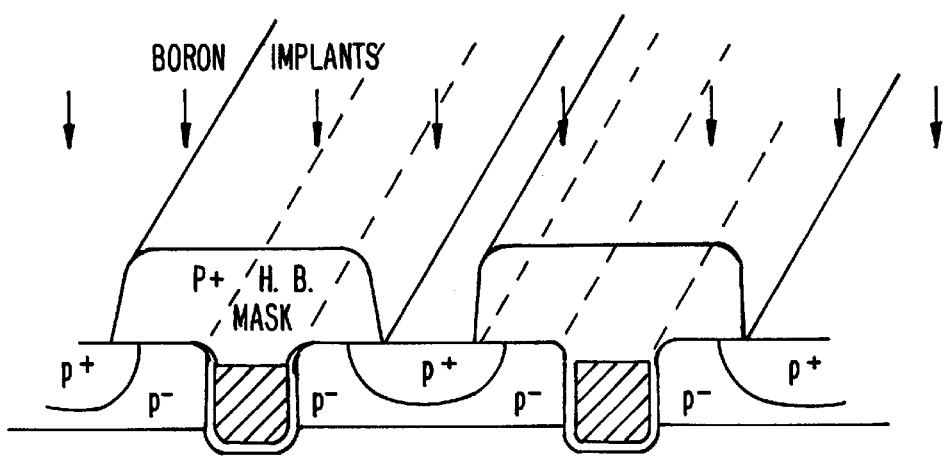
Figure 5:
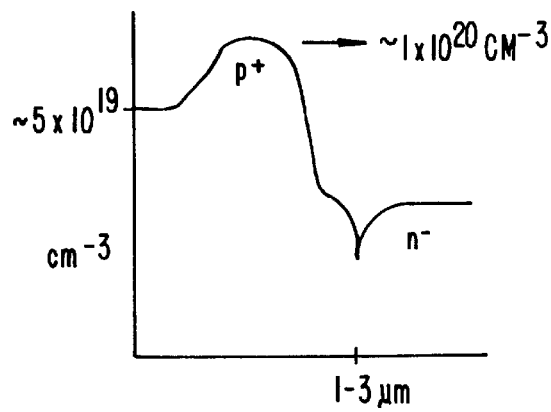
FIGS. 5 and 5b are spreading resistance profile graphs, reflecting the dopant concentration distribution at different regions of the transistor.

First, a mask is formed over the areas that will not be doped to p+, as shown in FIG. 4h. (It is noted that this masking step is not required if the p+ heavy body is formed later, after the dielectric layer has been applied and patterned for contact holes. (see FIG. 4k, below) so that the dielectric itself provides a mask.) As discussed above, it is preferred that the junction at the interface between the p– well and the p+ heavy body be abrupt. To accomplish this, a double implant of dopant (e.g., boron) is performed. For example, a preferred double implant is a first boron implant at an energy of 150 to 200 keV and a dose of 1E15 to 5E15 cm$^{-2}$, and a second boron implant at an energy of 20 to 40 keV and a dose of 1E14 to 1E15 cm$^{-2}$. The high energy first implant brings the p+ heavy body as deep as possible into the substrate, so that it will not compensate the n+ source junction to be introduced later. The second, lower energy/lower dose implant extends the p+ heavy body from the deep region formed during the first implant up to the substrate surface to provide the p+ contact 18. The resulting p+ heavy body junction is preferably about 0.4 to 1 $\mu$m deep at this stage of the process (final junction depth after drive-in is preferably about 0.5 to 1.5 $\mu$m deep), and includes a region of high dopant concentration near the interface with the p– well, and a region of relatively low dopant concentration at the contact surface of the p+ heavy body. A preferred concentration distribution is shown in FIG. 5.

It will be appreciated by those skilled in the art that the abrupt junction can be formed in many other ways, e.g., by diffused dopants, by using a continuous dopant source at the surface or by using atoms that diffuse slowly.

After the formation of the p+ heavy body, a conventional resist strip process is performed to remove the mask, and a new mask is patterned to prepare the substrate for the formation of the n+ source junction. This mask is a n+ blocking mask and is patterned to cover the areas of the substrate surface which are to provide p+ contacts 18 (FIGS. 1 and 1b), as shown in FIG. 4i. This results in the formation of alternating p+ and n+ contacts after n-type doping (see lines A—A and B—B and cross-sectional views A—A and B—B in FIG. 4I, which correspond to FIGS. 1a and 1b).

Figure 5A:
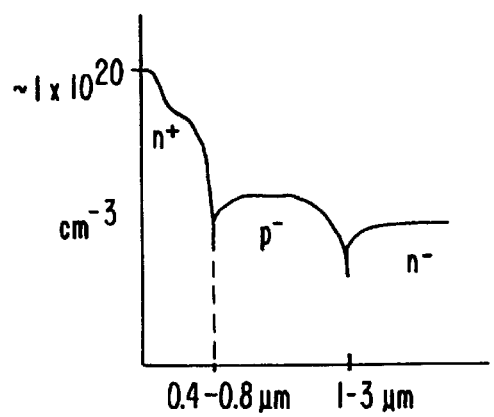
Figure 5B:
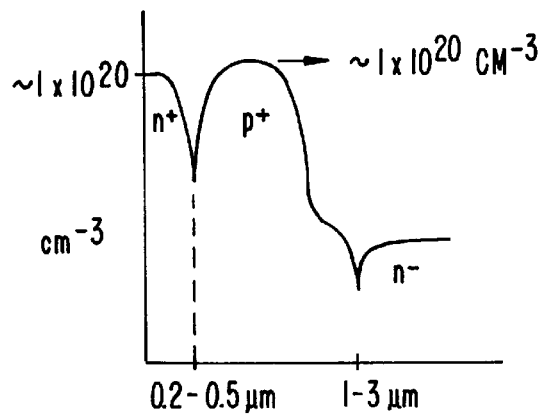

The n+ source regions and n+ contact are then formed using a double implant. For example, a preferred double implant process is a first implant of arsenic at an energy of 80 to 120 keV and a dose of 5E15 to 1E16 cm$^{-2}$ followed by a second implant of phosphorus at an energy of 40 to 70 keV and a dose of 1E15 to 5E15 cm$^{-2}$. The phosphorus implant forms a relatively deep n+ source junction, which allows more process flexibility in the depth of the polysilicon recess, as discussed above. Phosphorus ions will penetrate deeper into the substrate during implant and also during later diffusion steps. Advantageously, the n+ source regions will have a depth of about 0.4 to 0.8 $\mu$m after diffusion. The arsenic implant extends the n+ source to the substrate surface, and also forms the n+ contacts 16 (see FIGS. 1 and 1a) by compensating (converting) the p-type surface of the p+ heavy body to n-type in the desired contact area. The preferred sheet resistance profiles for the n+ source along the edge of the trench, and the n+ contact are shown in FIGS. 5a and 5b, respectively.

Thus, the alternating p+ and n+ contacts 18, 16, shown in FIG. 1 are formed by patterning the substrate with appropriate masks and doping with the first p+ implant and the second n+ implant, respectively, as described above. This manner of forming the alternating contacts advantageously allows an open cell array having a smaller cell pitch than is typical for such arrays and thus a higher cell density and lower Rds$_{on}$.

Next, a conventional n+ drive is performed to activate the dopants. A short cycle is used, preferably 10 min at 900° C., so that activation occurs without excessive diffusion.

A dielectric material, e.g., borophosphate silicate glass (BPSG), is then deposited over the entire substrate surface and flowed in a conventional manner (FIG. 4j), after which the dielectric is patterned and etched (FIG. 4k) to define electrical contact openings over the n+ and p+ contacts 16, 18.

As noted above, the p+ heavy body implant steps can be performed at this point, if desired (rather than prior to n+ source formation), eliminating the need for a mask and thus reducing cost and process time.

Next, the dielectric is reflowed in an inert gas, e.g., a nitrogen purge. If the p+ body has been implanted immediately prior, this step is required to activate the p+ dopant. If the p+ body was implanted earlier, prior to the n+ drive, this step can be omitted if the dielectric surface is sufficiently smooth-edged around the contact openings.

The cell array is then completed by conventional metalization, passivation deposition and alloy steps, as is well known in the semiconductor field.

Other embodiments are within the claims. For example, while the description above is of an n-channel transistor, the processes of the invention could also be used to form a p-channel transistor. To accomplish this, "p" and "n" would simply be reversed in the above description, i.e., where "p" doping is specified above the region would be "if" doped instead, and vice versa.

What is claimed is:

1. A method of making a heavy body structure for a trenched DMOS transistor comprising:
    providing a semiconductor substrate;
    forming a plurality of trenches into the substrate;
    implanting a first dopant at a first energy and dosage into the substrate, to form a doped well;
    implanting, into said well and between adjacent trenches, a second dopant at a second energy and dosage to form a first doped portion of a heavy body; and
    implanting, into said well and between adjacent trenches, a third dopant at a third energy and dosage to form a second doped portion of said heavy body,
    wherein the first portion of the heavy body is deeper than the second portion of the heavy body, and wherein said dosage of said second dopant has a doping concentration that is greater than said dosage of said third dopant.

2. The method of claim 1 wherein said first and second dopants both comprise boron.

3. The method of claim 1 wherein said first energy is from about 30 to 100 keV.

4. The method of claim 3 wherein said first dosage is from about 1E13 to 1E15 cm$^{-2}$.

5. The method of claim 1 wherein said second energy is from about 150 to 200 keV.

6. The method of claim 5 wherein said second dosage is from about 1E15 to 5E15 cm$^{-2}$.

7. A method of manufacturing a trenched field effect transistor comprising:
   forming an epitaxial layer on a semiconductor substrate;
   patterning and etching a plurality of trenches into the epitaxial layer;
   lining each trench with a gate dielectric layer;
   depositing polysilicon to fill the dielectric-lined trenches;
   doping the polysilicon with a dopant of a first type;
   patterning the epitaxial layer and implanting a dopant of a second, opposite type, in regions between adjacent trenches, to form a plurality of wells interposed between said adjacent trenches;
   patterning the epitaxial layer and implanting a dopant of the second type, in regions between adjacent trenches, to form a plurality of second dopant type contact areas and a plurality of heavy bodies positioned within the wells;
   patterning the epitaxial layer and implanting a dopant of the first type to provide source regions and first dopant type contact areas; and
   applying a dielectric to the surface of the semiconductor substrate and patterning the dielectric to expose electrical contact areas,
   wherein the implanting step for forming the heavy bodies comprises implanting a first dopant at a first energy and dosage and a second dopant at a second energy and dosage, said second energy and dosage being less than said first energy and dosage, respectively.

8. The method of manufacturing a trenched field effect transistor of claim 7 wherein the trenches are patterned to extend in one direction and be substantially parallel to each other.

9. The method of manufacturing a trenched field effect transistor of claim 7 wherein the patterning and implanting steps further comprise arranging the first dopant type contact areas and second dopant type contact areas in alternation and extend linearly between adjacent trenches.

10. The method of manufacturing a tenched field effect transistor of claim 7 wherein the implanting step for forming the source regions comprises implanting a first dopant at a first energy and dosage and a second dopant at a second energy and dosage, the second energy and dosage being less than the first energy and dosage, respectively.

11. The method of manufacturing a trenched field effect transistor of claim 7 wherein the heavy bodies are formed prior to forming the source regions.

12. The method of manufacturing a trenched field effect transistor of claim 7 wherein the source regions are formed prior to the heavy bodies.

13. The method of manufacturing a trenched field effect transistor of claim 7 further comprising a step of forming a field termination structure around a periphery of the field effect transistor.

14. The method of manufacturing a trenched field effect transistor of claim 13 wherein said field termination structure is formed by forming a deep well doped with a dopant of the second dopant type.

15. The method of manufacturing a trenched field effect transistor of claim 7 wherein said dielectric is applied before the steps of forming the heavy bodies and second dopant type contact areas, and the dielectric provides a mask for the patterning of the heavy bodies and second dopant type contacts.

16. The method of claim 1 wherein said third dopant comprises boron and said third dosage is from about 1E14 to 1E15cm$^{-2}$.

17. The method of claim 16 wherein said third energy is from about 20 to 40 keV.

18. The method of manufacturing a trenched field effect transistor of claim 13 wherein said field terminations structure is formed by forming a trench ring.

* * * * *

UNITED STATES PATENT AND TRADEMARK OFFICE
CERTIFICATE OF CORRECTION

PATENT NO. : 6,521,497 B2
DATED : February 18, 2003
INVENTOR(S) : Mo

It is certified that error appears in the above-identified patent and that said Letters Patent is hereby corrected as shown below:

Column 4,
Line 38, should read:
-- Figs. 5, 5a and 5b are spreading resistance profile graphs, reflecting the dopant concentration distribution at different regions of the transistor. --

Signed and Sealed this

Twenty-fourth Day of February, 2004

JON W. DUDAS
*Acting Director of the United States Patent and Trademark Office*